(12) United States Patent
Yoneda

(10) Patent No.: US 8,600,539 B2
(45) Date of Patent: Dec. 3, 2013

(54) SUBSTRATE PROCESSING APPARATUS

(75) Inventor: Akihiko Yoneda, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 251 days.

(21) Appl. No.: 12/084,886

(22) PCT Filed: Jan. 25, 2007

(86) PCT No.: PCT/JP2007/051162
§ 371 (c)(1),
(2), (4) Date: Jul. 3, 2008

(87) PCT Pub. No.: WO2007/086458
PCT Pub. Date: Aug. 2, 2007

(65) Prior Publication Data
US 2009/0018692 A1 Jan. 15, 2009

(30) Foreign Application Priority Data

Jan. 27, 2006 (JP) ................................. 2006-018947

(51) Int. Cl.
*H01L 21/02* (2006.01)
*G06F 3/048* (2013.01)

(52) U.S. Cl.
USPC ........... 700/121; 715/772; 715/272; 715/275; 715/764; 715/500; 700/95; 700/108; 700/174; 700/117; 700/100; 438/14; 438/5; 118/696

(58) Field of Classification Search
USPC .............. 700/95, 108, 174, 121, 83; 715/273, 715/272, 275, 764
See application file for complete search history.

(56) References Cited

U.S. PATENT DOCUMENTS 5,591,299 A 1/1997 Seaton et al.
6,115,034 A 9/2000 Tanaka et al.
(Continued)

FOREIGN PATENT DOCUMENTS

JP A-05-135064 6/1993
JP A-08-222887 8/1996
(Continued)

OTHER PUBLICATIONS

Sematech, strategic Cell Controller (SCC) user Interce Style Guide 1.0, 1992, pages 99.*
(Continued)

*Primary Examiner* — Ryan A. Jarrett
*Assistant Examiner* — Olvin Lopez Alvarez
(74) *Attorney, Agent, or Firm* — Oliff & Berridge, PLC

(57) ABSTRACT

A substrate processing apparatus which can securely show the status of recipe transition is provided. In a substrate processing apparatus 100 including a main control unit 312 which sends a control instruction to process a substrate, and a sub control unit 314 which carries out control of the apparatus in accordance with the control instruction from main control unit 312, the main control unit 312 has a memory unit 317 which stores plural recipes, a display control unit 336 which accepts an execution instruction to cause an arbitrary recipe of the plural recipes to be executed, and a display unit 334 which displays the arbitrary recipe designated by the display control unit 336, on an operation screen 308. When an execution instruction to cause another recipe stored in the recipe storage means to be executed is received during the execution of the arbitrary recipe, the arbitrary recipe and this another recipe are displayed on the operation screen 308 together with a factor which has generated the execution instruction to cause this another recipe to be executed.

16 Claims, 11 Drawing Sheets

(56) References Cited

U.S. PATENT DOCUMENTS

| | | | |
|---|---|---|---|
| 6,148,244 | A | 11/2000 | Tucker et al. |
| 6,282,457 | B1 | 8/2001 | Miura et al. |
| 6,625,512 | B1 * | 9/2003 | Goodwin ................... 700/121 |
| 6,629,003 | B1 * | 9/2003 | Frizzell et al. ................. 700/97 |
| 6,646,660 | B1 | 11/2003 | Patty |
| 6,834,370 | B1 | 12/2004 | Brandl et al. |
| 6,907,308 | B1 * | 6/2005 | Bartlett et al. ............... 700/121 |
| 6,952,808 | B1 * | 10/2005 | Jamieson et al. ............. 715/833 |
| 7,065,714 | B1 | 6/2006 | Theel et al. |
| 7,113,838 | B2 * | 9/2006 | Funk et al. ................... 700/108 |
| 7,123,980 | B2 | 10/2006 | Funk et al. |
| 7,191,082 | B2 * | 3/2007 | Obi et al. ....................... 702/81 |
| 7,210,864 | B2 | 5/2007 | Higashi et al. |
| 7,369,913 | B2 | 5/2008 | Heminway et al. |
| 7,522,968 | B2 | 4/2009 | Hongkham et al. |
| 7,738,983 | B2 * | 6/2010 | Yamaji et al. ................ 700/100 |
| 7,837,804 | B2 | 11/2010 | Ohno et al. |
| 7,877,161 | B2 * | 1/2011 | Tomoyasu et al. ........... 700/121 |
| 7,896,649 | B2 * | 3/2011 | Koyama et al. .............. 432/247 |
| 7,974,729 | B2 * | 7/2011 | Takahashi et al. ........... 700/121 |
| 8,382,910 | B2 * | 2/2013 | Numakura et al. ............. 134/18 |
| 2002/0116083 | A1 * | 8/2002 | Schulze ......................... 700/108 |
| 2004/0019393 | A1 * | 1/2004 | Heider et al. ................... 700/31 |
| 2004/0185583 | A1 * | 9/2004 | Tomoyasu et al. ................ 438/8 |
| 2004/0225384 | A1 | 11/2004 | Onishi et al. |
| 2006/0184264 | A1 * | 8/2006 | Willis et al. .................. 700/108 |
| 2006/0221269 | A1 * | 10/2006 | Kawaguchi ..................... 349/58 |
| 2006/0224269 | A1 | 10/2006 | Aihara |
| 2006/0260746 | A1 | 11/2006 | Ikuhara et al. |
| 2007/0012337 | A1 * | 1/2007 | Hillman et al. ................ 134/1.3 |
| 2007/0038324 | A1 * | 2/2007 | Takizawa et al. ............. 700/105 |
| 2007/0199655 | A1 * | 8/2007 | Yokouchi et al. ......... 156/345.11 |
| 2008/0115077 | A1 * | 5/2008 | Cooper et al. ................. 715/772 |
| 2009/0082894 | A1 * | 3/2009 | Pettus et al. .................. 700/105 |
| 2009/0114150 | A1 | 5/2009 | Yoneda et al. |
| 2009/0164933 | A1 * | 6/2009 | Pederson et al. .............. 715/772 |
| 2010/0152879 | A1 * | 6/2010 | Weetman et al. ............. 700/110 |

FOREIGN PATENT DOCUMENTS

| | | | |
|---|---|---|---|
| JP | 09-082589 | * | 3/1997 |
| JP | 9-082589 | * | 3/1997 |
| JP | 9-134857 | * | 5/1997 |
| JP | A-2000-077288 | | 3/2000 |
| JP | A-2000-208385 | | 7/2000 |
| JP | A-2001-230209 | | 8/2001 |
| JP | A-2003-099113 | | 4/2003 |
| JP | 2003-229409 | | 8/2003 |
| JP | 2003-272985 | * | 9/2003 |
| JP | A-2005-072259 | | 3/2005 |

OTHER PUBLICATIONS

Webopedia, "definition of the term Window", Oct. 11, 2011, pages 2.*
Intellectual Property Law resource center, "In Re Schneller 397 F2d 350", Jun. 27, 1968, pp. 1-7.*
Modular Process Technology Corporation, "RTP-600S Rapid Thermal Processor", Jul. 31, 2003, pages 87.*
Jul. 9, 2011 Office Action issued in Korean Application No. 10-2011-07007087 (with translation).
Korean Office Action issued Jan. 31, 2012 in Korean Application No. 10-2011-7026006.
Korean Office Action issued Sep. 30, 2011 in Korean Application No. 10-2010-7011891.
Korean Office Action issued Mar. 29, 2010 in Korean Application No. 10-2008-7013085.
Japanese Office Action issued Dec. 7, 2011 in Japanese Application No. 2007-555995.
Korean Office Action dated Sep. 5, 2012 issued in Korean Patent Application No. 10-2012-7013615 (with translation).
Korean Notification of Submission of Written Opinions issued in Korean Patent Application No. 10-2011-07007087 dated Apr. 2, 2012 (with translation).
Siemens, "SIMATIC SFC for SIMATIC S7", Nov. 2006, p. 34.
Fisher Rosemount Systems, "DeltaV Batch Active Step Change", May 26, 2004, pp. 1-22.
Office Action dated May 25, 2012 issued in U.S. Appl. No. 13/064,255.
Office Action dated Jan. 16, 2013 issued in U.S. Appl. No. 13/064,255.

* cited by examiner

SEQUENCE PROCESSING (S10)

SUBSTRATE PROCESSING APPARATUS

TECHNICAL FIELD

The present invention relates to a substrate processing apparatus for processing a substrate of semiconductor device or the like.

BACKGROUND ART

A substrate processing apparatus of this type in which an operation recipe (process recipe) is displayed on a display screen of the apparatus body is known. On a list of steps of the process recipe, steps are displayed in different colors, for example, a step which is completed in its execution is displayed in blue and a step which is being executed is displayed in red. The progress status of the process recipe is thus shown.

DISCLOSURE OF THE INVENTION

Problems that the Invention is to Solve

However, in the case where another recipe (for example, a sub recipe) is executed in accordance with a step described in the process recipe, what kind of step is designated, whether the sub recipe is executed, and the sub recipe which is currently being executed and the history of the sub recipe are not known. When a trouble has occurred in the apparatus, recovery processing (in this case, identification of the cause of the trouble) takes time. Also, in the case where a reset recipe is executed and the apparatus is temporarily stopped, it is not known whether it is executed in accordance with the user's (operator's) intention or it is executed because of the occurrence of an error in the apparatus. That is, since the history of transition of recipes until the reset recipe is executed and a factor that has caused the execution of the reset recipe cannot be grasped, the operator must rely on his or her own experience to find out what kind of recovery processing is appropriate. Particularly when the operator is a beginner, it takes time to carry out trouble shooting operation. (Here, a sub recipe refers to a recipe prepared by separating a step that is repeatedly used plural times in a process recipe, from the process recipe, and it is executed by being accessed in a predetermined step of the process recipe.)

It is an object of the present invention to provide a substrate processing apparatus which grasps the history of transition among plural recipes and reduces the time taken for a trouble.

Means for Solving the Problems

A first aspect of the present invention resides in a substrate processing apparatus including first control means for sending a control instruction to process a substrate, and second control means for carrying out control of the apparatus in accordance with the control instruction from this first control means. The first control means has recipe storage means for storing plural recipes, display control means for accepting an execution instruction to cause an arbitrary recipe of the plural recipes to be executed, and display means for displaying the arbitrary recipe designated by the display control means, on an operation screen. When an execution instruction to cause another recipe stored in the recipe storage means to be executed is received during the execution of the arbitrary recipe, the arbitrary recipe and this another recipe are displayed on the operation screen together with a factor which has generated the execution instruction to cause this another recipe to be executed.

A second aspect of the present invention resides in a substrate processing apparatus including first control means for sending a control instruction to process a substrate, and second control means for carrying out control of the apparatus in accordance with the control instruction from this first control means. The first control means has recipe storage means for storing plural recipes, display control means for accepting an execution instruction to cause one recipe of the plural recipes to be executed, and display means for displaying the recipe designated by the display control means, on an operation screen. Of the recipes stored in the recipe storage means, a recipe that is executed first to a recipe which is currently being executed, and a factor which has generated an execution instruction to cause these recipes to be executed are displayed on the operation screen.

A third aspect of the present invention resides in a substrate processing apparatus including first control means for sending a control instruction to process a substrate, and second control means for carrying out control of the apparatus in accordance with the control instruction from this first control means. The first control means has recipe storage means for storing at least one recipe or more including plural steps, display control means for accepting an execution instruction to cause the recipe to be executed, and display means for displaying the recipe designated by the display control means, on an operation screen. When an execution instruction to cause another recipe stored in the recipe storage means to be executed is received during the execution of the recipe, step information which is currently being executed, of this another recipe, and step information which is executed when the execution instruction is generated, of the recipe, are displayed on the operation screen together with a factor which has generated the execution instruction to cause this another recipe to be executed.

A fourth aspect of the present invention resides in a substrate processing apparatus including first control means for sending a control instruction to process a substrate, and second control means for carrying out control of the apparatus in accordance with the control instruction from this first control means. The first control means has recipe storage means for storing at least one or more recipes of different kinds, display control means for accepting an execution instruction to cause a recipe of a certain kind, of the recipes of different kinds, to be executed, and display means for displaying the recipe designated by the display control means, on an operation screen. When an execution instruction to cause a recipe of another kind stored in the recipe storage means to be executed is received during the execution of the recipe of a certain kind, the recipe of a certain kind and the recipe of another kind are displayed on the operation screen together with a factor which has generated the execution instruction to cause this recipe of another kind to be executed.

A first recipe display method according to the present invention includes a step of storing plural recipes by recipe storage means, a step of accepting an execution instruction to cause an arbitrary recipe of the plural recipes to be executed by display control means, a step of displaying the arbitrary recipe designated by the display control means, on an operation screen by display means, and a step of, when an execution instruction to cause another recipe stored in the recipe storage means to be executed is received during the execution of the arbitrary recipe, displaying the arbitrary recipe and this another recipe on the operation screen together with a factor which has generated the execution instruction to cause this another recipe to be executed.

A second recipe display method according to the present invention includes a step of storing plural recipes by recipe storage means, a step of accepting an execution instruction to cause one recipe of the plural recipes to be executed by display control means, a step of displaying the recipe designated by the display control means, on an operation screen by display means, and a step of displaying a recipe which is executed first to a recipe which is currently being executed, of the recipes stored in the recipe storage means, and a factor which has generated an execution instruction to cause these recipes to be executed, on the operation screen.

Here, an execution instruction refers to an instruction inputted and given by a user (operator) using input means such as a button on the operation screen, or an instruction from an external device such as a host computer. A control instruction refers to an instruction (target value) given to a component or the like which constitutes the apparatus in such a way that a target value that is preset in a recipe or the like can be reached.

Advantages of the Invention

According to the present invention, when an execution instruction to cause another recipe to be executed is given during the execution of an arbitrary recipe, a factor which has generated the execution instruction to cause this another recipe to be executed is displayed and also the arbitrary recipe and this another recipe are displayed on the operation screen. Therefore, transition of recipes and factors in the transition of the recipes can be quickly grasped. It is possible to reduce the time for trouble shooting when a trouble has occurred, and also reduce the recovery processing time.

Figure 1:
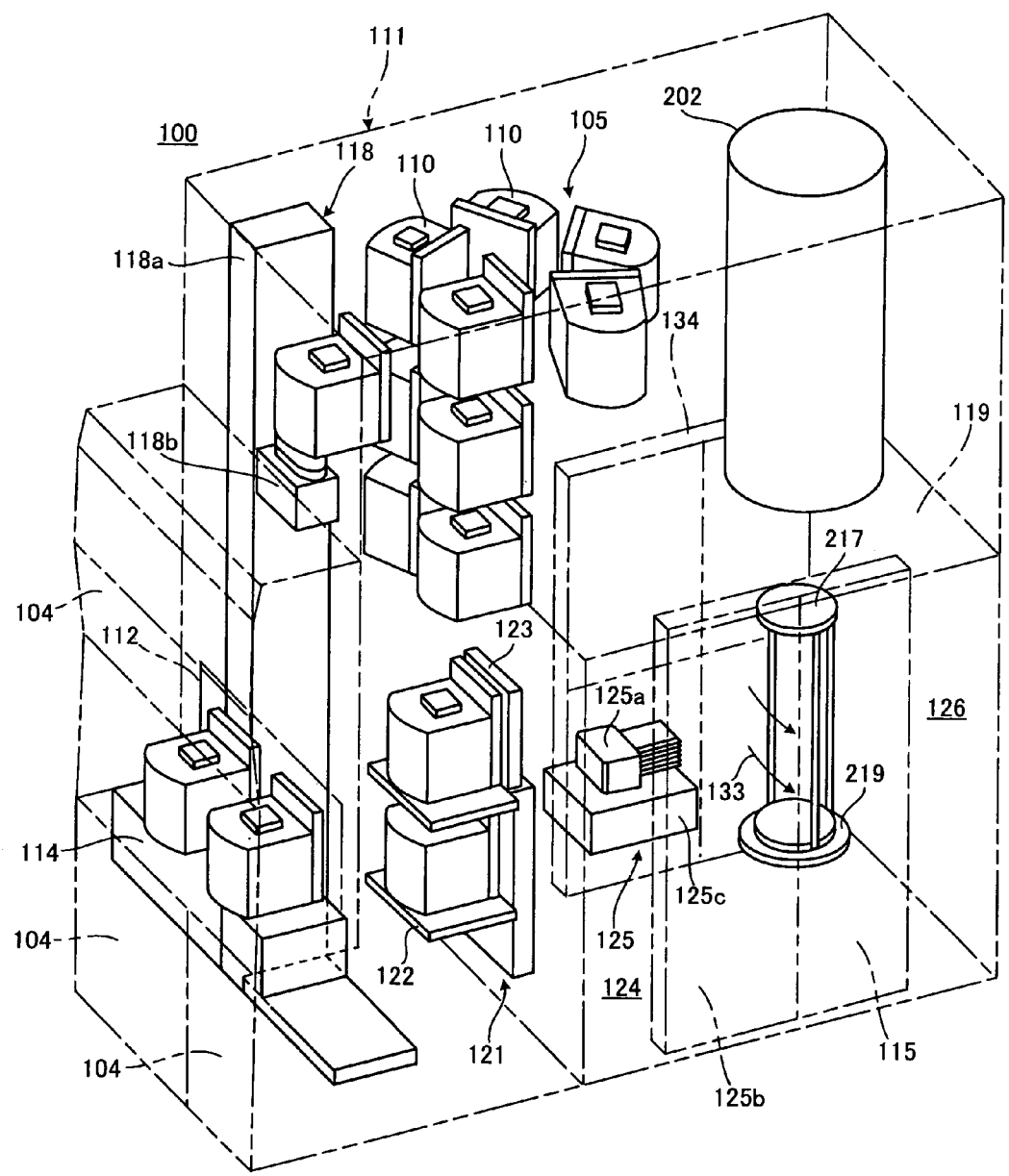
FIG. 1 is a perspective view showing a substrate processing apparatus according to an embodiment of the invention.

DESCRIPTION OF REFERENCE NUMERALS AND SIGNS 100 substrate processing apparatus
103 front maintenance port
104 front maintenance door
105 rotary pod shelf
110 pod
111 casing
111a front wall
112 pod carry-in and carry-out port
113 front shutter
114 load port
115 boat elevator
116 supporting pole
117 shelf board
118 pod carrying device
118a pod elevator
118b pod carrying mechanism
119 sub casing
119a front wall of sub casing
120 wafer carry-in and carry-out port
121 pod opener
122 setting stage
123 cap attaching and detaching mechanism
124 shift chamber
125 wafer shifting mechanism
125a wafer shifting device
125b wafer shifting device elevator
125c tweezers
126 standby section
128 arm
133 clean air
134 clean unit
135 notch aligning device
147 furnace opening shutter
200 wafer
202 processing furnace
217 boat
219 seal cap
300 substrate processing system
302 host computer
304 communication line
306 input and output device
308 operation screen
310 PMC
312 main control unit
314 sub control unit
316 CPU
317 memory unit
318 ROM
320 RAM
322 transmitting and receiving processing unit
324 I/O control unit
326 temperature control unit
328 gas control unit
330 pressure control unit 332 input unit
334 display unit
335 temporary memory unit
336 display control unit
338 heater
340 gas pipe
342 MFC
344 exhaust pipe
346 pressure sensor
348 valve
352 history display section
354 factor display section
356 display button for displaying recipe progress
358 reset button
360 step display section
362 step number
364 step 1D
366 step remaining time
368 number of times of step execution

BEST MODE FOR CARRYING OUT THE INVENTION

Figure 2:
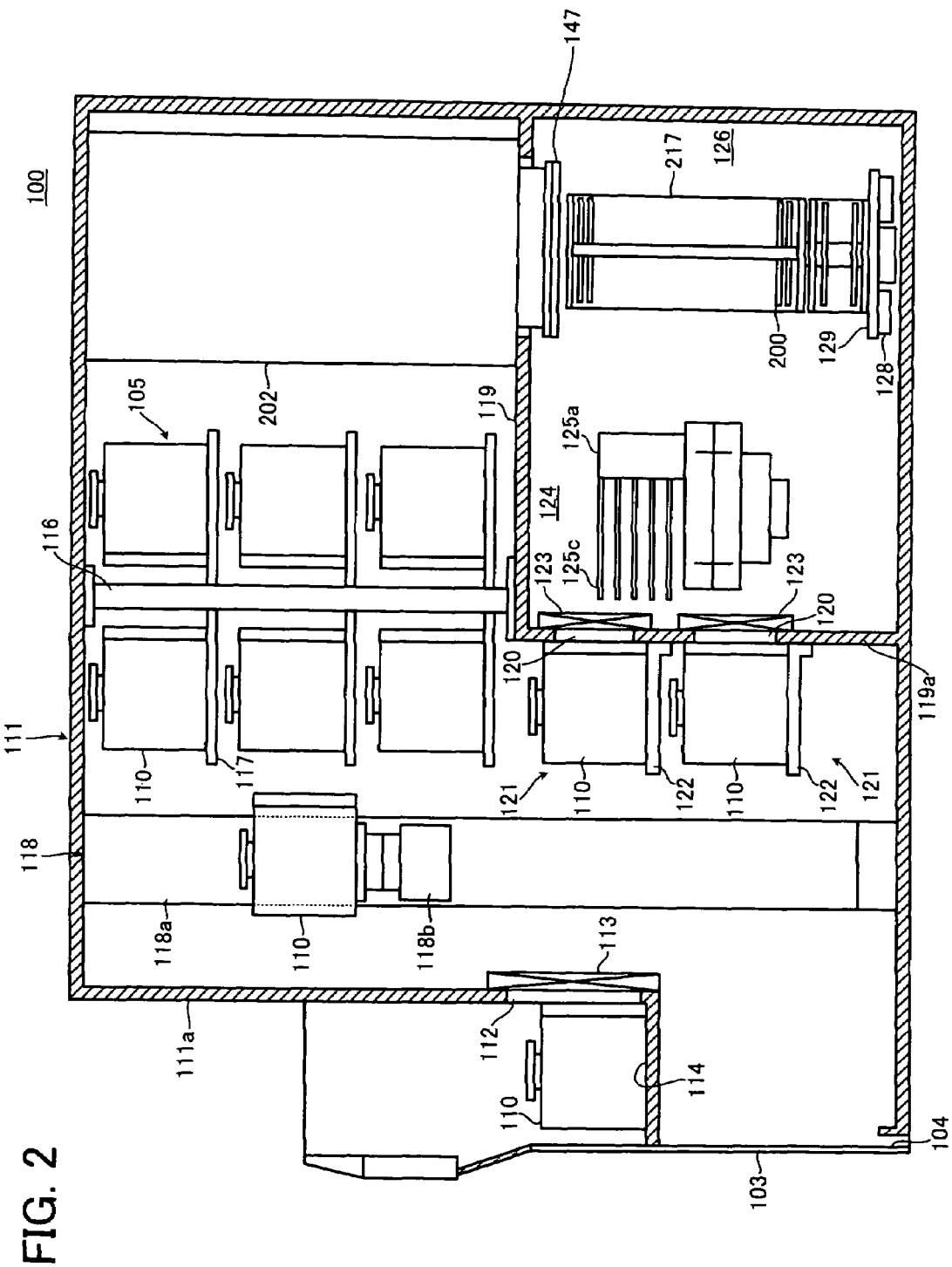
FIG. 2 is a perspective side view showing the substrate processing apparatus according to the embodiment of the invention.

In the best mode for carrying out the present invention, as an example, a substrate processing apparatus is configured as a semiconductor manufacturing apparatus which embodies a processing apparatus in a method of manufacturing a semiconductor device (IC). In the following description, a case is described where a vertical apparatus which carries out oxidation, diffusion processing or CVD processing on a substrate (hereinafter simply referred to as a processing apparatus) is applied as a substrate processing apparatus. FIG. 1 is shown as a perspective view of a substrate processing apparatus applied to the present invention. FIG. 2 is a perspective side view of the substrate processing apparatus of FIG. 1.

As shown in FIG. 1 and FIG. 2, a substrate processing apparatus 100 according to the invention in which a hoop (substrate container, hereinafter referred to as a pod) 110 is used as a wafer carrier housing a wafer (substrate) 200 made of silicon or the like, has a casing 111. At a front forward part of a front wall 111a of the casing 111, a front maintenance port 103 is opened as an opening provided to enable maintenance, and front maintenance doors 104, 104 to open and close this front maintenance port 103 are fitted.

In the front wall 111a of the casing 111, a pod carry-in and carry-out port (substrate container carry-in and carry-out port) 112 is opened in a manner of penetrating the inside and outside of the casing 111. The pod carry-in and carry-out port 112 is configured to be opened and closed by a front shutter (substrate container carry-in and carry-out port opening and closing mechanism) 113.

On the front forward side of the pod carry-in and carry-out port 112, a load port (substrate container delivery stage) 114 is installed. The load port 114 is configured to set and align the pod 110. The pod 110 is carried in onto the load port 114 by an in-process carrying device (not shown) and is carried out from the top of the load port 114.

At an upper part in a substantially central section in the back and forth directions in the casing 111, a rotary pod shelf (substrate container setting shelf) 105 is installed. The rotary pod shelf 105 is configured to store plural pods 110. That is, the rotary pod shelf 105 has a supporting pole 106 which is provided vertically upright and is intermittently rotated within a horizontal plane, and plural shelf boards (substrate container setting stages) 117 radially supported at each position in upper, middle and lower stages by the supporting pole 116. The plural shelf boards 117 are configured to hold the plural pods 110 in their respective setting states.

Between the load port 114 and the rotary pod shelf 105 in the casing 111, a pod carrying device (substrate container carrying device) 108 is installed. The pod carrying device 118 includes a pod elevator (substrate container lifting mechanism) 118a capable of lifting and lowering while holding the pod 110, and a pod carrying mechanism (substrate container carrying mechanism) 118b as a carrying mechanism. The pod carrying device 118 is configured to carry the pod 110 between the load port 114, the rotary pod shelf 105, and a pod opener (substrate container lid opening and closing mechanism) 121 by continuous operation of the pod elevator 118a and the pod carrying mechanism 118b.

At a lower part in the substantially central section in the back and forth directions in the casing 111, a sub casing 119 is constructed across the rear end. In a front wall 119a of the sub casing 119, a pair of wafer carry-in and carry-out ports (substrate carry-in and carry-out ports) 120 to carry the wafer 200 into and out of the sub casing 119 is opened in a way of being arrayed in vertical two stages. A pair of pod openers 121, 121 is installed on the upper- and lower-stage wafer carry-in and carry-out ports 120, 120. The pod openers 121 have setting stages 122, 122 for setting the pods 110 thereon, and cap attaching and detaching mechanisms (lid attaching and removing mechanisms) 123, 123 to attach and detach the caps (lids) of the pods 110. The pod openers 121 are configured to open and close the wafer take-in and take-out port of the pod 110 by attaching and detaching the cap of the pod 110 set on the setting stage 122 by the cap attaching and detaching mechanism 123.

The sub casing 119 forms a shift chamber 124 which is insulated in terms of fluids from the installation space of the pod carrying device 118 and the rotary pod shelf 105. In a forward area of the shift chamber 124, a wafer shifting mechanism (substrate shifting mechanism) 125 is installed. The wafer shifting mechanism 125 includes a wafer shifting device (substrate shifting device) 125a capable of rotate or move the wafer 200 straight in a horizontal direction, and a wafer shifting device elevator (substrate shifting device lifting mechanism) 125b to lift and lower the wafer shifting device 125a. As schematically shown in FIG. 1, the wafer shifting device elevator 125b is installed between a right end part of the pressure-resistant casing 111 and a right end part of the forward area of the shift chamber 124 in the sub casing 119. These wafer shifting device elevator 125b and wafer shifting device 125a are configured to charge and discharge the wafer 200 to and from a boat (substrate holding tool) 217, by their continuous operation, using tweezers (substrate holder) 125c of the wafer shifting device 125a as a setting section for the wafer 200.

In a rear area of the shift chamber 124, a standby section 126 is configured which houses the boat 217 and has it stand by. A processing furnace 202 is provided above the standby section 126. A lower end part of the processing furnace 202 is configured to be opened and closed by a furnace opening shutter (furnace opening and closing mechanism) 147.

As schematically shown in FIG. 1, a boat elevator (substrate holding tool lifting mechanism) 115 to lift and lower the boat 217 is installed between the right end part of the pressure-resistant casing 111 and the right end part of the standby section 126 of the sub casing 119. A seal cap 219 as a lid is horizontally attached to an arm 128 as a connecting tool connected to the lift stage of the boat elevator 115. The seal cap 219 is configured to vertically support the boat 217 and be capable of closing the lower end part of the processing furnace 202.

The boat 217 has plural holding members and is configured to horizontally hold each of plural (for example, 50 to 125) wafers 200 arrayed with their centers aligned in a vertical direction.

As schematically shown in FIG. 1, in the left end part of the shift chamber 124, which is opposite to the wafer shifting device elevator 125b and the boat elevator 115, a clean unit 134 including a supply fan and a dustproof filter to supply clean air 133, which is purified atmospheric or inert gas, is installed. Between the wafer shifting device 125a and the clean unit 134, a notch aligning device 135 as a substrate aligning device to align the position of wafers in the circumferential direction is installed, though not shown.

The clean air 133 emitted from the clean unit 134 is circulated to the notch aligning device 135 and the wafer shifting device 125a and to the boat 217 in the standby section 126, and then absorbed into a duct, not shown, and exhausted to outside of the casing 111, or circulated to the primary side (supply side) as the suction side of the clean unit 134 and again emitted into the shift chamber 124 by the clean unit 134.

Next, the operation of the substrate processing apparatus 100 of the invention will be described.

As shown in FIG. 1 and FIG. 2, when the pod 110 is supplied to the load pot 114, the pod carry-in and carry-out port 112 is opened by the front shutter 113. The pod 110 on the load port 114 is carried into the casing 111 from the pod carry-in and carry-out port 112 by the pod carrying device 118.

The pod 110 thus carried therein is automatically carried and delivered to a designated shelf board 117 of the rotary pod shelf 105 by the pod carrying device 118 and temporarily stored there. After that, the pod 110 is carried and delivered to one pod opener 121 from the shelf board 117 and temporarily stored there. After that, the pod 110 is carried to one pod opener 121 from the shelf board 117 and shifted onto the setting stage 122. Alternatively, the pod 110 is directly carried to the pod opener 121 and shifted onto the setting stage 122. In this case, the wafer carry-in and carry-out port 120 of the pod opener 121 is closed by the cap attaching and detaching mechanism 123 and the clean air 133 is circulated in and fills the shift chamber 124. For example, as nitrogen gas as the clean air 133 fills the shift chamber 124, the oxygen concentration is set at 20 ppm or less, which is much lower than the oxygen concentration within the casing 111 (ambient atmosphere).

The pod 110 set on the setting stage 122 has its opening side end surface pressed against the opening edge side of the wafer carry-in and carry-out port 120 in the front wall 119a of the sub casing 119, and also has its cap detached by the cap attaching and detaching mechanism 123, thus having its wafer outlet and inlet port opened.

When the pod 110 is opened by the pod opener 121, the wafer 200 is picked up from the pod 110 by the tweezers 125c of the wafer shifting device 125a through the wafer outlet and let port. After the wafer is aligned by the notch aligning device 135, not shown, the wafer is carried into the standby section 126 in the rear part of the shift chamber 124 and charged into the boat 217. The wafer shifting device 125a, which has delivered the wafer 200 to the boat 217, returns to the pod 110 and charges the next wafer 110 to the boat 217.

During the charging operation of the wafer to the boat 217 in this one (upper or lower) pod opener 121 by the wafer shifting mechanism 125, another pod 110 is carried and shifted onto the other (lower or upper) pod opener 121 from the rotary pod shelf 105 by the pod carrying device 118 and the opening operation of the pod 110 by the pod opener 121 is carried out simultaneously.

When predetermined number of wafers 200 are charged into the boat 217, the lower end part of the processing furnace 202 closed by the furnace opening shutter 147 is opened by the furnace opening shutter 147. Then, as the seal cap 219 is lifted up by the boat elevator 115, the boat 217 holding the group of the wafers 200 is carried (loaded) into the processing furnace 202.

After the loading, arbitrary processing is carried out by processing recipe executing to the wafers 200 in the processing furnace 202.

After the processing, the wafers 200 and the pods 110 are discharged from the casing approximately in the reverse procedure of the above, except for the wafer aligning step by the notch aligning device 135, not shown.

Next, an example of a substrate processing system 300 using the above-described substrate processing apparatus 100 will be described with reference to FIG. 3.

Figure 3:
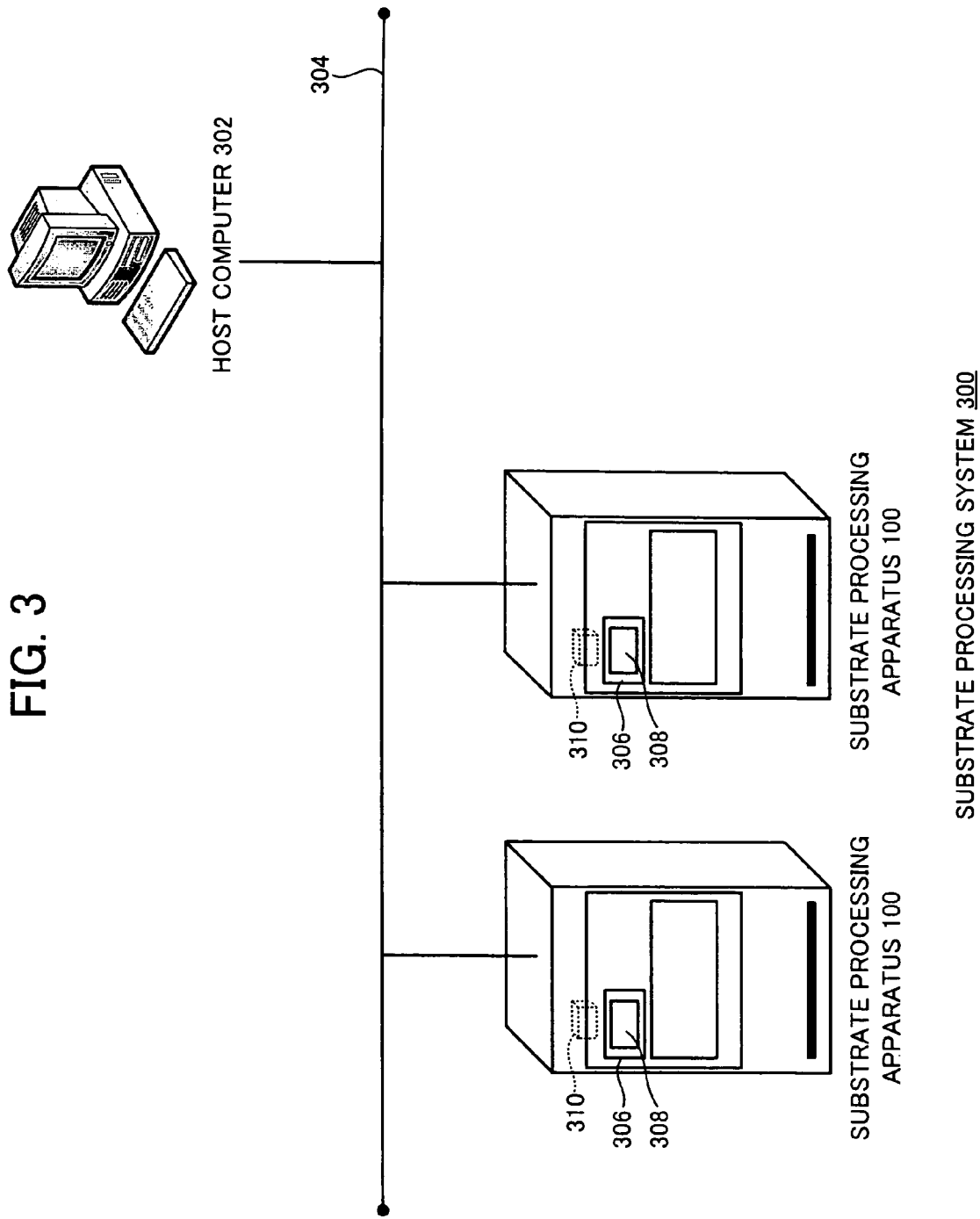
FIG. 3 is a view showing an exemplary configuration of a substrate processing system in which the substrate processing apparatus according to the embodiment of the invention is used.

As shown in FIG. 3, the substrate processing system 300 has a host computer 302 and plural units of the above-described substrate processing apparatus 100. The plural substrate processing apparatuses 100 and the host computer 302 are connected via a communication line 304, for example, LAN or the like. An instruction (output signal) from the host computer 302 is sent (outputted) to each substrate processing apparatus 100.

An input and output device 306 is provided integrally with the substrate processing apparatus 100 or via a network, and has an operation screen 308. On the operation screen 308, an input screen where predetermined data is inputted by the user (operator) and a display screen showing the status of the apparatus and the like are displayed. Moreover, various command buttons are provided.

Also a process module controller (PMC) 310 is provided in the substrate processing apparatus 100. Each device in the substrate processing apparatus 100 is controlled by the PMC 310.

Figure 4:
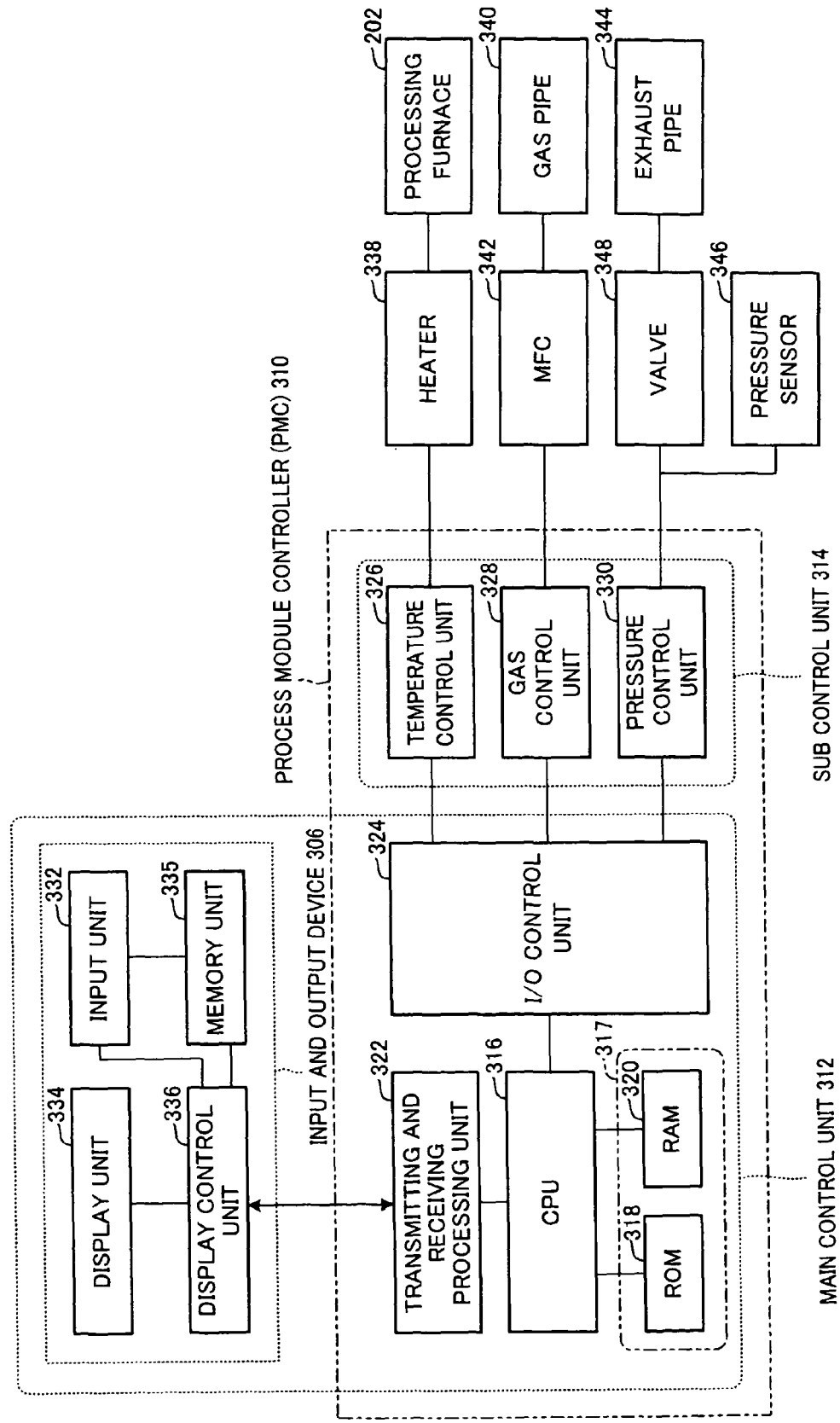
FIG. 4 is a view showing an exemplary hardware configuration of the substrate processing apparatus according to the embodiment of the invention, particularly a PMC.

FIG. 4 shows a hardware configuration mainly of the PMC 310.

The PMC 310 has a part of a main control unit (main controller) 312 as first control means, and a sub control unit (sub controller) 314 as second control means.

The main control unit 312 has a CPU 316, a memory unit 317 as memory means, a transmitting and receiving processing unit 322 which transmits and receives data to and from the input and output device 306 and the host computer 302, an I/O control unit 324 which performs I/O control with the CPU 316 and the sub control unit 314, and the input and output device 306. The main control unit 312 sends control data (control instruction) to process the substrates to the sub control unit 314 by an execution instruction of various recipes prepared or edited on the above-described operation screen 308 of the input and output device 306.

The memory unit 317 includes, for example, a ROM (read-only memory) 318 and a RAM (random-access memory) 320 and the like and stores a sequence program, plural recipes, input data (input instruction) inputted by the input and output device 306, history data of recipe commands (PM commands and step commands), history data of recipes and so on.

The recipes include various recipes such as an alarm recipe, an abort recipe and a reset recipe, which will be describer later, as well as process recipes and sub recipes. These recipes are stored in the memory unit 317. The memory unit 317 also stores not only production information (data such as temperature, gas flow rate, and pressure) but also history data such as alarm occurrence information and recipe transition information, as history data of the recipes. The recipe transition information includes recipe screen transition information and recipe transition factor information.

The input and output device 306 has an input unit 332 which accepts operator's (user's) input data (input instruction) from the operation screen 308, a display unit 334 which displays the data and the like stored in the memory unit 317, a temporary memory unit 335 which stores the input data accepted by the input unit 332 until it is sent to the transmitting and receiving processing unit 322 by a display control unit 336, and the display control unit 336 which accepts the input data (input instruction) from the input unit 332 and sends the input data to the display unit 334 or the transmitting and receiving processing unit 322.

As will be described later, the display control unit 336 is configured to accept an instruction (execution instruction) to cause an arbitrary recipe of the plural recipes stored in the memory unit 317 to be executed by the CPU 316 via the transmitting and receiving processing unit 322. The display unit 334 is configured to display the arbitrary recipe designated by the instruction from the display control unit 336, on the operation screen 308.

The sub control unit 314 has a temperature control unit 326, a gas control unit 328 and a pressure control unit 330, which will be described later, and a carrying control unit, not shown. The temperature control unit 326 controls the temperature in the processing furnace 202 by a heater 338 provided at an outer circumferential part of the above-described processing furnace 202. The gas control unit 328 controls the supply quantity of reaction gas or the like supplied into the processing furnace 202 in accordance with an output value from a mass flow controller (MFC) 342 provided in a gas pipe 340 of the processing furnace 202. The pressure control unit 330 is configured to control the pressure in the processing chamber 202 by opening and closing a valve 348 in accordance with an output value of a pressure sensor 346 provided in an exhaust pipe 344 of the processing furnace 202. Also, the wafer shifting device 125, the boat elevator 126 and the like are controlled by the carrying control unit, not shown. In this manner, the sub control unit 314 is configured to control each part (heater 338, MFC 342 and valve 348 or the like) of the substrate processing apparatus 100 (shown in FIG. 1) in accordance with the control instruction from the main control unit 312.

For example, when data for setting a recipe is inputted by the input unit 332 of the input and output device 306, the input data (input instruction) is stored in the memory unit 335 and displayed on the display unit 334 via the display control unit 336, and is also sent to the transmitting and receiving processing unit 322 of the PMC 310 by the display control unit 336. The CPU 316 of the main control unit 312 stores the input data into, for example, the RAM 320 of the memory unit 317, and causes the setting input of the recipe stored, for example, in the ROM 318 to be decided. The CPU 316 starts a sequence program and calls and executes a command of the recipe stored, for example, in the RAM 320 of the memory unit 317 in accordance with the sequence program. Thus, steps are sequentially executed and a control instruction to process the substrate is sent to the sub control device 314 via the I/O control unit 324. The sub control device 314 controls each part (heater 338, MFC 342 and valve 348 or the like) in the substrate processing apparatus 100 in accordance with the control instruction from the main control instruction. Thus, the processing of the above-described wafers 200 (shown in FIG. 2) is carried out. Also with respect to an instruction from the host computer 302, the above recipe execution processing may be similarly carried out.

Next, the display of recipe transition history will be described with reference to FIG. 5 to FIG. 8.

Figure 5:
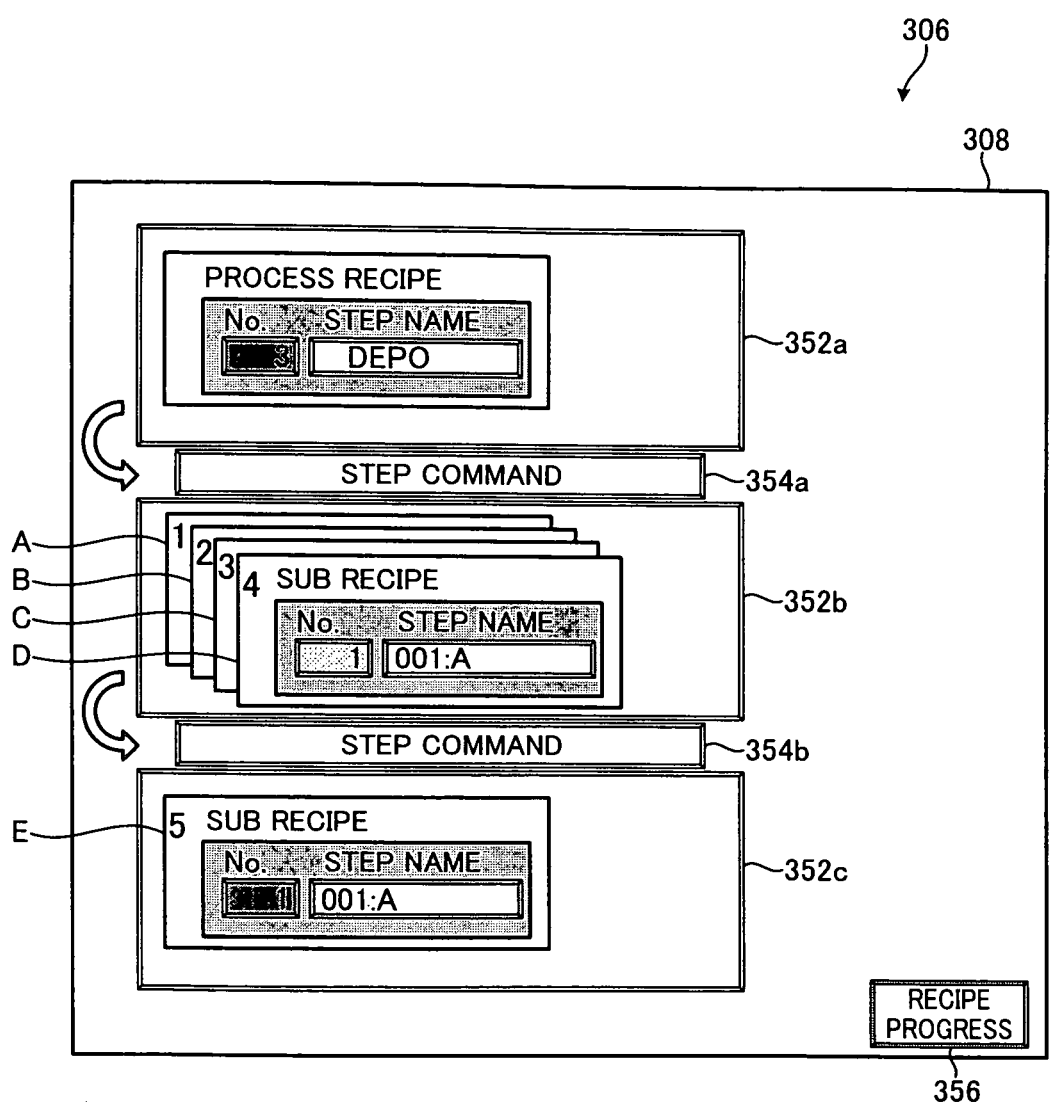
FIG. 5 is a view showing an example of recipe transition history on an operation screen of the substrate processing apparatus according to the embodiment of the invention.

FIG. 5 shows an exemplary display of recipe transition history. As shown in FIG. 5, history display sections 352a, 352b, 352c, factor display sections 354a, 354b, 354c, and a display button 356 are displayed on the operation screen 308 of the input and output device 306. For example, as the operator (user) presses the display button 356, the above-described history display sections 352a, 352b, 352c and factor display sections 354a, 354b, 354c are displayed.

Here, recipe transition history is displayed which shows a status where a first sub recipe (the history display section 352b in FIG. 5) is called from a third step (DEPO) of a process recipe (the history display section 352a in FIG. 5) and then a second sub recipe (the history display section 352c in FIG. 5) is called from the first sub recipe.

That is, when it has received an execution instruction (in this example, an instruction of the process recipe) to cause another recipe (in this example, a sub recipe) stored in the memory unit 317 to be executed during the execution of an arbitrary recipe (in this example, the process recipe), the above-described display control unit 336 (shown in FIG. 4) gives an instruction to display this another recipe on the operation screen 308 together with a factor (in this example, a step command) which has caused the generation of the execution instruction to cause this another recipe to be executed.

More specifically, a status is shown where the sub recipe of the first hierarchical level (A in the history display section 352b in FIG. 5) is called from the process recipe (the history display section 352a in FIG. 5) by the step command (the factor display section 354a in FIG. 5), followed by the sub recipe of the second hierarchical level (B in the history display section 352b in FIG. 5) being called from the sub recipe of the first hierarchical level, then followed by the sub recipe of the third hierarchical level (C in the history display section 352b in FIG. 5) being called from the sub recipe of the second hierarchical level, then followed by the sub recipe of the fourth hierarchical level (D in the history display section 352b in FIG. 5) being called from the sub recipe of the third hierarchical level, and followed by the sub recipe of the fifth hierarchical level (E in the history display section 352c in FIG. 5) being called from the sub recipe of the fourth hierarchical level by a step command (the factor display section 534b in FIG. 5).

In this manner, the display control unit 336 (shown in FIG. 4) instructs the display unit 334 to display the history from the recipe that has been first executed (in this example, the process recipe) up to the recipe which is currently being executed (in this example, the sub recipe) on the operation screen 308 and also to display the factor (in this example, step command) of transition of each recipe on the operation screen 308.

Here, a step command is described (inputted) at the time of editing a recipe. In a step where a step command is set during the process recipe, the recipe is executed in accordance with the content of this step command.

A trigger (factor) of transition of a predetermined recipe is displayed in the factor display sections 354a, 354b. In FIG. 5, an example is shown in which the process recipe has made a transition in accordance with a "step command". The sub recipes of the first to fourth hierarchical levels are displayed in an overlapping manner. However, the factor which has caused the sub recipe of each hierarchical level to be called may also be displayed.

The step commands include "RESET", "END", "HOLD", "BUZZER", "JUMP (STEP)", "SUB RECIPE" and so on. In FIG. 5, "SUB RECIPE" that serves as a factor (trigger) of transition of a recipe is set.

The other step commands than "SUB RECIPE" will be briefly described now. "RESET" is to immediately interrupt the recipe which is being executed, and reset the operation. "END" is to immediately interrupt the recipe which is being executed, and result in "ABNORMAL END". "HOLD" is to set a HOLD state without shifting to the next step after the execution of the designated step. "BUZZER" is to designate BUZZER and execute that step. "JUMP (STEP)" is to jump to a designated step within the process recipe. Also, whether to display the factor for each of these step commands may be designated.

Moreover, while FIG. 5 shows the exemplary status where a recipe has made transition in accordance with a step command as a factor (trigger), other factors of transition of a recipe may include an alarm condition, a PM command and the like. Here, with respect to the alarm condition, processing to deal with an error when the error has occurred is defined by an "alarm condition parameter (table)" (a table showing processing to deal with each error), and it is one of error monitoring functions of the PMC 310 (shown in FIG. 4). Meanwhile, the PM command is a command instruction which can be received by the PMC 310. It may be an instruction from the input and output device 306 as an external unit or an instruction from within the PMC 310 (the above-described alarm condition table). For example, a case where an "ABORT" button and the like are provided and pressed on the operation screen 308 is the former. A case where an abort recipe is set in the alarm condition table is the latter.

Also, while FIG. 5 shows the exemplary status where transition has been made from the process recipe to the sub recipe, the other predetermined kinds of recipes to which transition can be made may include a reset recipe, an alarm recipe, an abort recipe and so on.

Here, the alarm recipe is associated with the process recipe and is used for recovery processing when anomaly has occurred and for avoidance of risk (processing to eliminate the cause of occurrence of anomaly or processing to avoid the cause of occurrence of anomaly and the like). The alarm recipe can be designated only by using the setting of the above-described alarm condition table. After the end of this alarm recipe, the steps from the calling of the process recipe are executed. Meanwhile, the abort recipe is substantially similar to the alarm recipe, but after the end of the abort recipe, the state of the final step of the abort recipe is maintained. The reset recipe is substantially similar to the abort recipe, but it can be arbitrarily executed even when the process recipe is not being executed (this will be described later with reference to FIG. 7).

Figure 10:
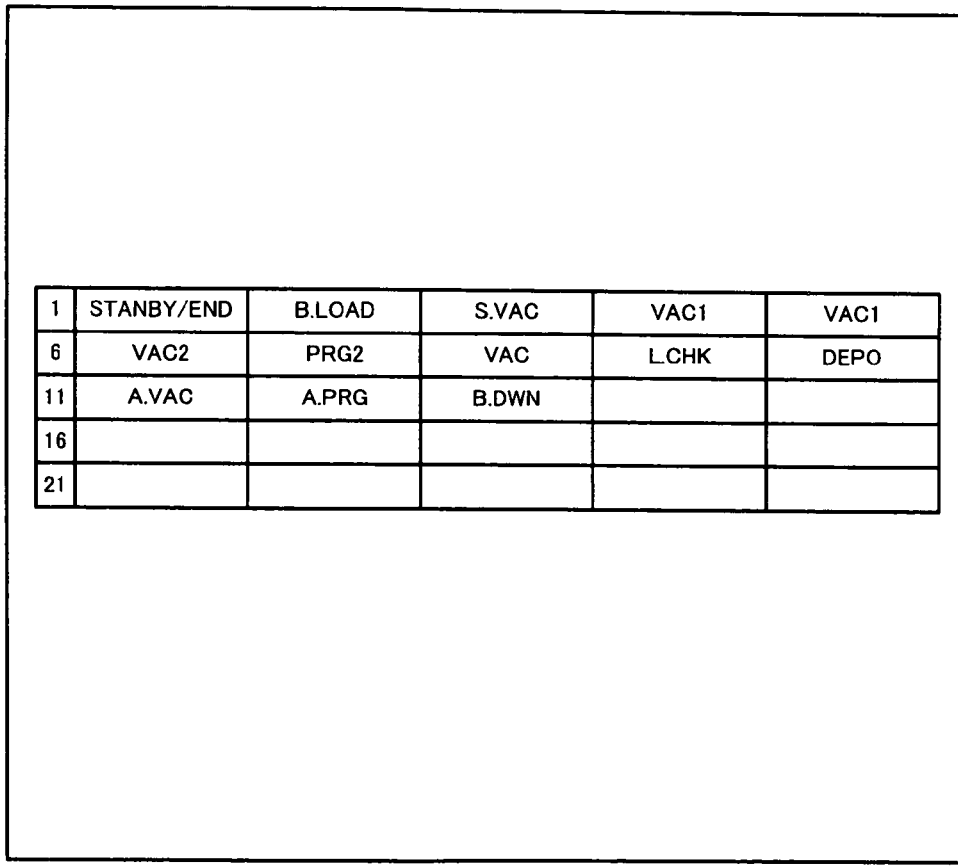
FIG. 10 is a view showing an exemplary display of recipe operation list (execution status) in a comparative example.

In the case where only the execution status of recipes is displayed on the operation screen 308, for example, as in a comparative example shown in FIG. 10, how transition from the process recipe has been made and how the reset recipe has been executed cannot be grasped. However, if the recipe transition history is displayed on the operation screen 308 as in FIG. 5, the status of recipe transition, such as which step of a predetermined recipe a trouble has occurred in, or which factor has caused the transition to the recipe which is being executed (for example, step command, alarm condition, and PM command), can be grasped easily and quickly.

Next, sequence processing based on the sequence program executed by the main control unit 312 will be described.

Figure 6:
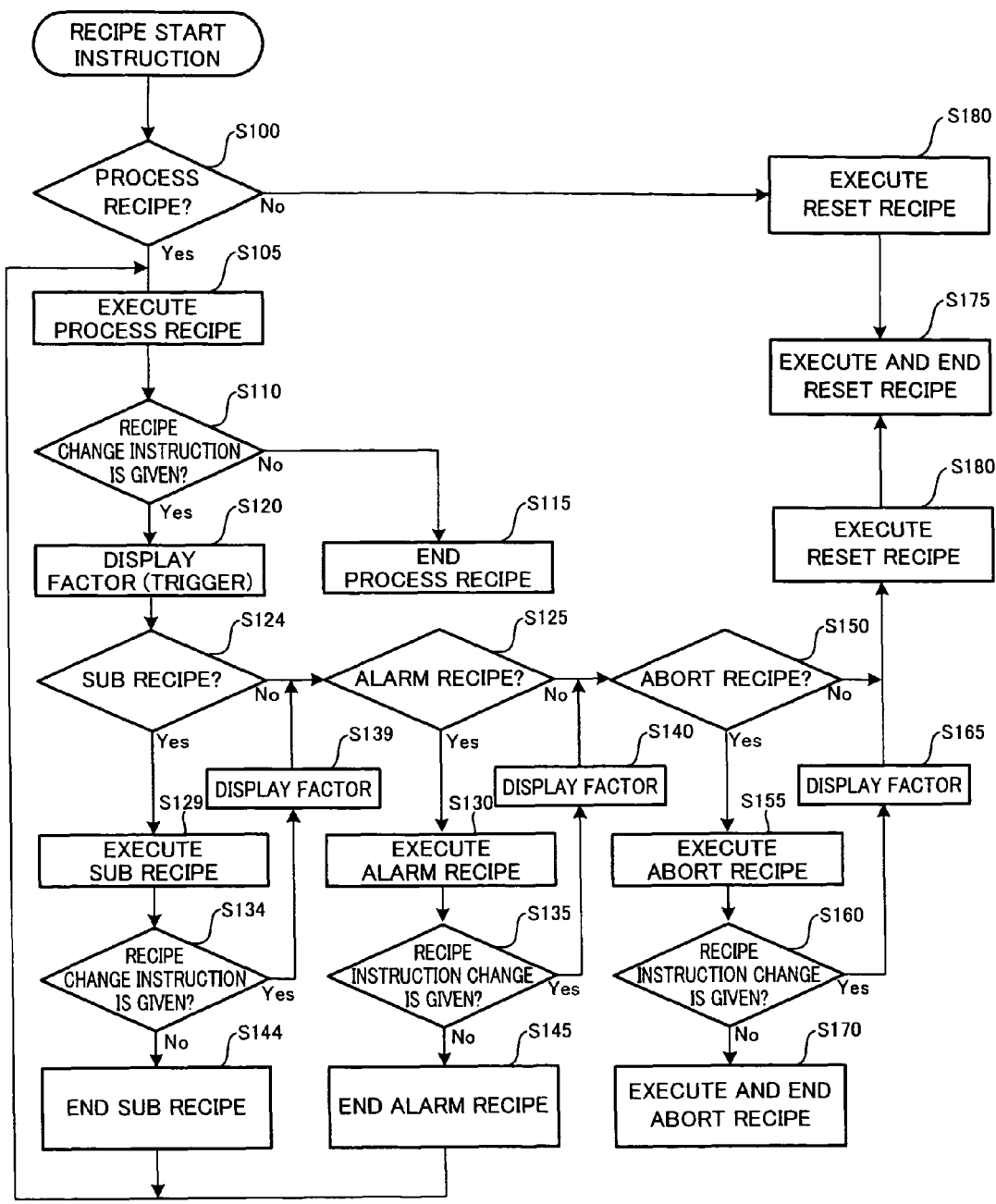
FIG. 6 is a flowchart illustrating a sequence program that is executed by a main control unit of the substrate processing apparatus according to the embodiment of the invention.

FIG. 6 is a flowchart illustrating the sequence processing (S10). This sequence program is started by a recipe start instruction in accordance with an input instruction from the input unit 332 of the input and output device 306 or in accordance with an instruction from the host computer 302.

As shown in FIG. 6, when a recipe start instruction is received, the main control unit 312 in step S100 determines whether the recipe to be executed is a process recipe or not. If it is a process recipe, the main control unit 312 shifts to the processing of step S105. Otherwise, that is, if it is not a process recipe, the main control unit 312 shifts to the processing of step S180.

In step S105, the main control unit 312 executes the process recipe and shifts to the processing of step S110.

In step S110, the main control unit 312 determines whether a recipe change instruction is given or not by a step command, alarm condition and PM command or like with respect to the process recipe which is currently being executed. If it is determined that a recipe change instruction is given, the main control unit 312 shifts to the processing of step S120. If it is determined that a recipe change instruction is not given, the main control unit 312 shifts to the processing of step S115.

In step S115, the main control unit 312 executes a predetermined step of the process recipe and ends the process recipe.

In step S120, the display control unit 336 displays the factor (trigger) of transition to another recipe in the factor display section 354 on the operation screen 308 and shifts to the processing of step S124.

In step S124, the main control unit 312 determines whether the recipe after the transition is a sub recipe or not. If the recipe after the transition is a sub recipe, the main control unit 312 shifts to the processing of step S129. If it is not a sub recipe, the main control unit 312 shifts to the processing of step S125.

In step S129, the main control unit 312 executes the sub recipe and shifts to the processing of step S134.

In step S134, the main control unit 312 monitors whether a recipe change instruction is given or not by a step command, alarm condition and PM command or the like with respect to the sub recipe which is being executed. If a recipe change instruction is given, the main control unit 312 shifts to the processing of step S139. If a recipe change instruction is not given, the main control unit 312 shifts to the processing of step S144.

In step S139, the display control unit 336 displays the factor (trigger) of transition to another recipe in the factor display section 354 on the operation screen 308 and shifts to the processing of step S125.

In step S144, the main control unit 312 executes a predetermined step of the sub recipe, then ends the sub recipe, and shifts again to the processing of step S105.

In step S125, the main control unit 312 determines whether the recipe after the transition is an alarm recipe or not. If the recipe after the transition is an alarm recipe, the main control unit 312 shifts to the processing of step S130. If it is not an alarm recipe, the main control unit 312 shifts to the processing of step S150.

In step S130, the main control unit 312 executes the alarm recipe and shifts to the processing of step S135.

In step S135, the main control unit 312 monitors whether a recipe change instruction is given or not by a step command, alarm condition and PM command or the like with respect to the alarm recipe which is being executed. If a recipe change instruction is given, the main control unit 312 shifts to the processing of step S140. If a recipe change instruction is not given, the main control unit 312 shifts to the processing of step S145.

In step S140, the display control unit 336 displays the factor (trigger) of transition to another recipe in the factor display section 354 on the operation screen 308 and shifts to the processing of step S150.

In step S145, the main control unit 312 executes a predetermined step of the alarm recipe, then ends the alarm recipe, and shifts again to the processing of step S105.

In step S150, the main control unit 312 determines whether the recipe after the transition is an abort recipe or not. If the recipe after the transition is an abort recipe, the main control unit 312 shifts to the processing of step S155. If it is not an abort recipe, the main control unit 312 shifts to the processing of step S175.

In step S155, the main control unit 312 executes the abort recipe and shifts to the processing of step S160.

In step S160, the main control unit 312 monitors whether a recipe change instruction is given or not by a step command, alarm condition and PM command or the like with respect to the abort recipe which is being executed. If a recipe change instruction is given, the main control unit 312 shifts to the processing of step S165. If a recipe change instruction is not given, the main control unit 312 shifts to the processing of step S170.

In step S165, the display control unit 336 displays the factor (trigger) of transition to another recipe (reset recipe) in the factor display section 354 on the operation screen 308 and shifts to the processing of step S180.

In step S170, the main control unit 312 executes a predetermined step of the abort recipe and ends the abort recipe. At this time, the substrate processing apparatus 100 is stopped in its operation in a secure state. Also, in this state, the operator carries out trouble shooting, which will be described later.

In step S180, the main control unit 312 executes the reset recipe and shifts to the processing of step S175.

In step S175, the main control unit 312 executes a predetermined step of the reset recipe and ends the reset recipe. Also at this time, the substrate processing apparatus 100 is stopped in its operation in a secure state. In this state, the operator can carry out trouble shooting, which will be described later.

Figure 7:
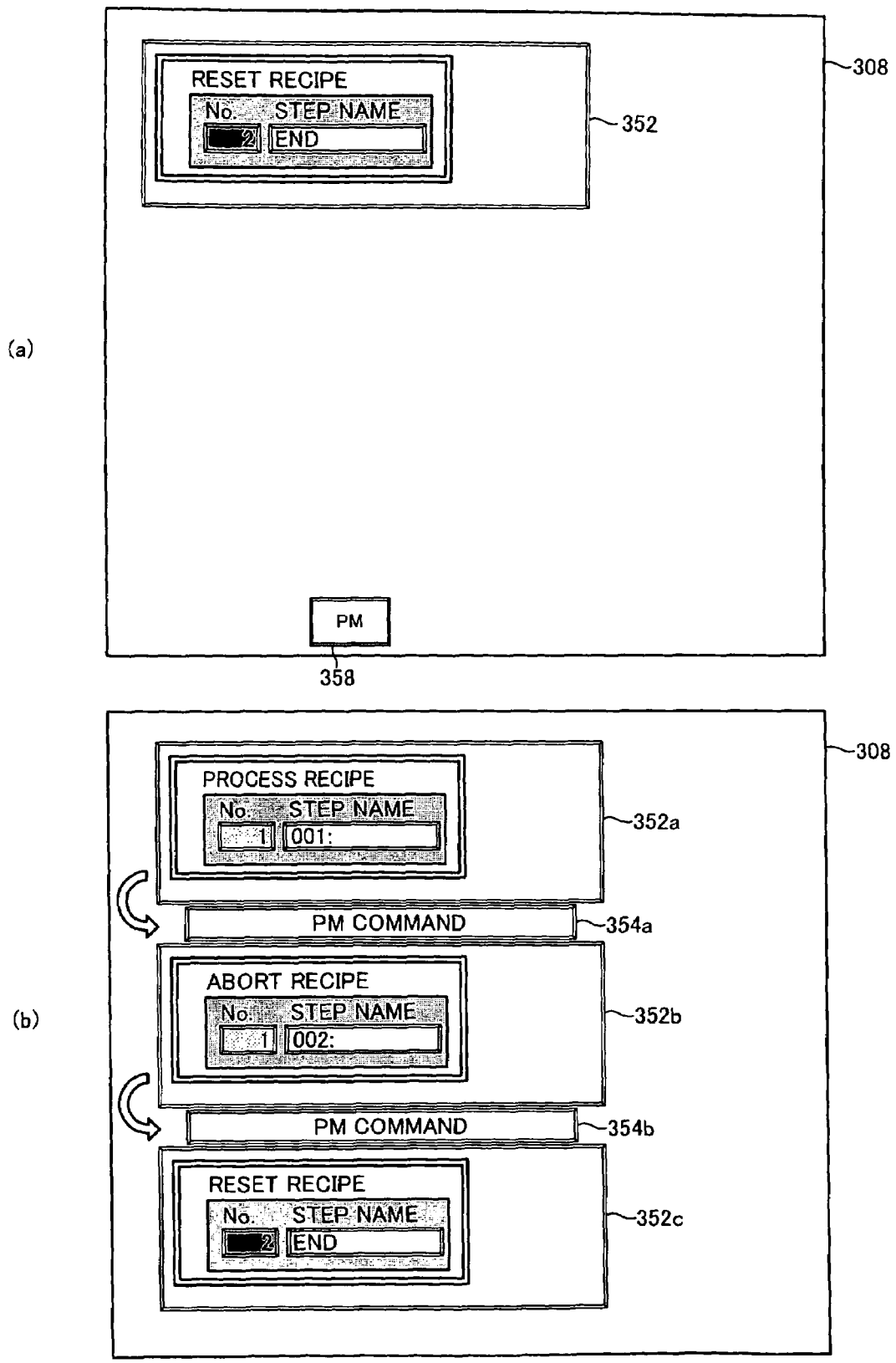
FIG. 7 is a view showing a second example of recipe transition history on the operation screen of the substrate processing apparatus according to the embodiment of the invention. Part (a) is an exemplary display of recipe transition history at the time when a reset recipe is singly executed. Part (b) is an exemplary display of recipe transition history at the time when a reset recipe is executed after transition from another recipe because of a certain factor.

FIG. 7 shows a second exemplary display of recipe transition history.

FIG. 7(a) is a view showing an example of recipe transition history in the case where a reset recipe is executed singly. FIG. 7(b) is a view showing an example of recipe transition history in the case where a reset recipe is executed as a result of transition from another recipe caused by a certain factor.

The reset recipe is to be executed when RESET processing is set as an alarm condition and an alarm to carry out this RESET processing has occurred, or when RESET is set as a step command and this setting step is reached, or when the displayed RESET button (not shown) is pressed by an operation of the PM command button 358 (which will be described later) displayed on the operation screen 308. Therefore, the reset recipe may be executed (singly executed) by the operator's (user's) intention or may be executed as a result of transition from another recipe such as a process recipe.

As shown in FIG. 7(a), for example, when the displayed RESET button (not shown) is pressed as the PM command button 358 displayed on the operation screen 308 is operated by the operator (user), the reset recipe is executed and the history display section 352 is displayed on the operation screen 308. If the RESET button (not shown) is pressed when the process recipe is not being executed, the reset recipe is executed (singly executed) and the history display section 352 is displayed on the operation screen 308 similarly to the above.

On the other hand, for example, when the reset recipe is executed as a result of transition from the process recipe, as shown in FIG. 7(b), the history display sections 352a, 352b, 352c and the factor display sections 354a, 354b, 354c and the like are displayed on the operation screen 308. FIG. 7(b) shows a status where transition to an abort recipe (the history display section 352b in FIG. 7) is made by a PM command (the factor display section 354a in FIG. 7) as a factor when the process recipe (the history display section 352a in FIG. 7(b)) is being executed, and then a reset recipe (the history display section 352c in FIG. 7) is being executed by a PM command (the factor display section 354b in FIG. 7) as a factor.

From the screen of FIG. 7(b), the operator can learn that the abort recipe is executed from the first step of the process recipe and then the reset recipe is executed from the first step of the abort recipe. Also, since the factors shown on this screen are PM commands, it can be learned that the abort recipe and the reset recipe are executed as the execution button on the operation screen 308 is pressed.

From these pieces of information (from the operation screen 308), it can be presumed that since the operator carelessly (erroneously) executed the abort recipe shortly after the execution of the process recipe (during its first step), the operator immediately pressed the button to execute the reset recipe. Moreover, since the history display sections 352a, 352b, 352c are presented as buttons, the operator can confirm more detailed information by pressing these buttons.

In this manner, the display of recipe transition history shown on the operation screen 308 differs between the case where the reset recipe is executed singly and the case where the reset recipe is executed as a result of transition from another recipe caused by a certain factor. Therefore, the user (operator) can grasp the status up to the execution of the recipe (reset recipe) which is being executed, by visually confirming the operation screen 308.

As described above, in the case where the reset recipe is executed singly, it is presumed that the operator (user) has grasped the state of the substrate processing apparatus 100 (shown in FIG. 1) and has caused the reset recipe to be executed by his or her own intention. On the other hand, in the case where the reset recipe is executed as a result of transition from the process recipe, a trouble (failure or the like) has occurred in the substrate processing apparatus 100 and the reset recipe is executed. That is, when it is confirmed that the reset recipe is executed as a result of transition from the process recipe or the like, the substrate processing apparatus 100 must be immediately investigated, or a maintenance worker must be contacted and trouble shooting operation must be done-immediately.

The reset recipe is a recipe to perform processing so as to end in a secure state, for example, from the execution state of the process recipe. Recovery from physical trouble of the substrate processing apparatus 100 cannot be made by executing the reset recipe alone. For example, if the reset recipe is executed because of malfunction of the valve 348 (shown in FIG. 4) in the substrate processing apparatus 100, the substrate processing apparatus 100 ends in a secure state. However, after that, recovery (replacement, repair and the like) of the valve 348 by the operator (user), maintenance worker or the like is necessary. Similarly, the reset recipe is executed, for example, in the case where the thermocouple of the heater 338 (shown in FIG. 4) is broken, but this thermocouple cannot be recovered by the reset recipe. Trouble shooting is an operation to eliminate the factor which has actually triggered the execution of the reset recipe. Specifically, it includes operations such as replacement and repair of a pump or heater.

In this invention, since the factor (history) which has caused the reset recipe to be executed can be quickly grasped, the time until the start of trouble shooting can be reduced and reduction in the recovery processing time can be realized.

Figure 8:
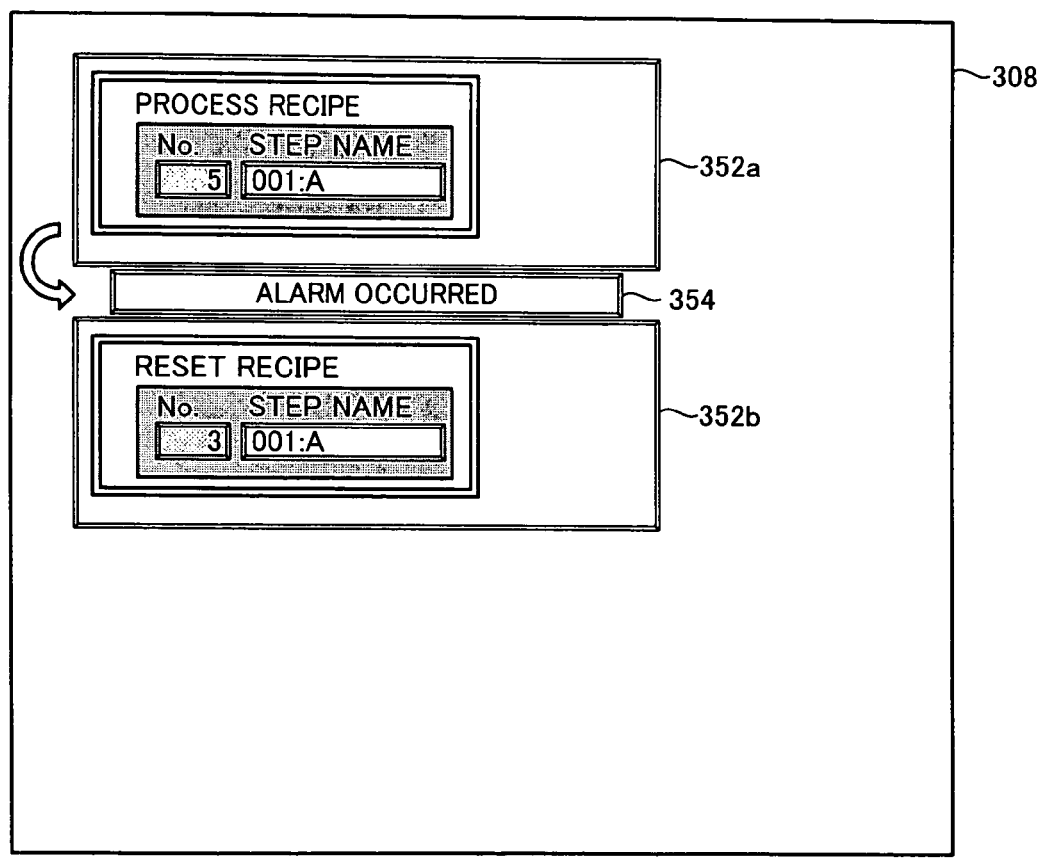
FIG. 8 is a view showing a third exemplary display of recipe transition history on the operation screen of the substrate processing apparatus according to the embodiment of the invention, and is an exemplary display of recipe transition history at the time when a reset recipe is executed by transition from a process recipe.

FIG. 8 shows a third exemplary display of recipe transition history.

FIG. 8 is a view illustrating an exemplary display in the case where direct transition to a reset recipe is made during the execution of a process recipe.

FIG. 8 shows on the operation screen 308 a status where a trouble has occurred in the fifth step (the history display section 352a in FIG. 8) of the process recipe during the execution of the process recipe, transition to the reset recipe has been made in accordance with an alarm condition (the factor display section 354 in FIG. 8), and the third step of the reset recipe (the history display section 352b in FIG. 8) is being executed. Thus, by visually confirming the operation screen 308, the operator (user) can grasp that a trouble has occurred in the fifth step of the process recipe, then transition to the reset recipe has been made in accordance with the alarm condition set in the fifth step, and the third step of the reset recipe is currently being executed. Therefore, the operator (user) confirms the recipe setting and trouble information and the like of the fifth step of the process recipe in accordance with FIG. 11, determines in what setting in the fifth step the trouble has occurred, carries out optimum recovery processing to deal with the trouble that has occurred, and takes measures to prevent the similar trouble from occurring again. In this manner, the detailed factor of a trouble can be quickly grasped and the time until trouble shooting is carried out can be reduced. Thus, reduction in the recovery processing time in the apparatus can be realized.

Figure 11:
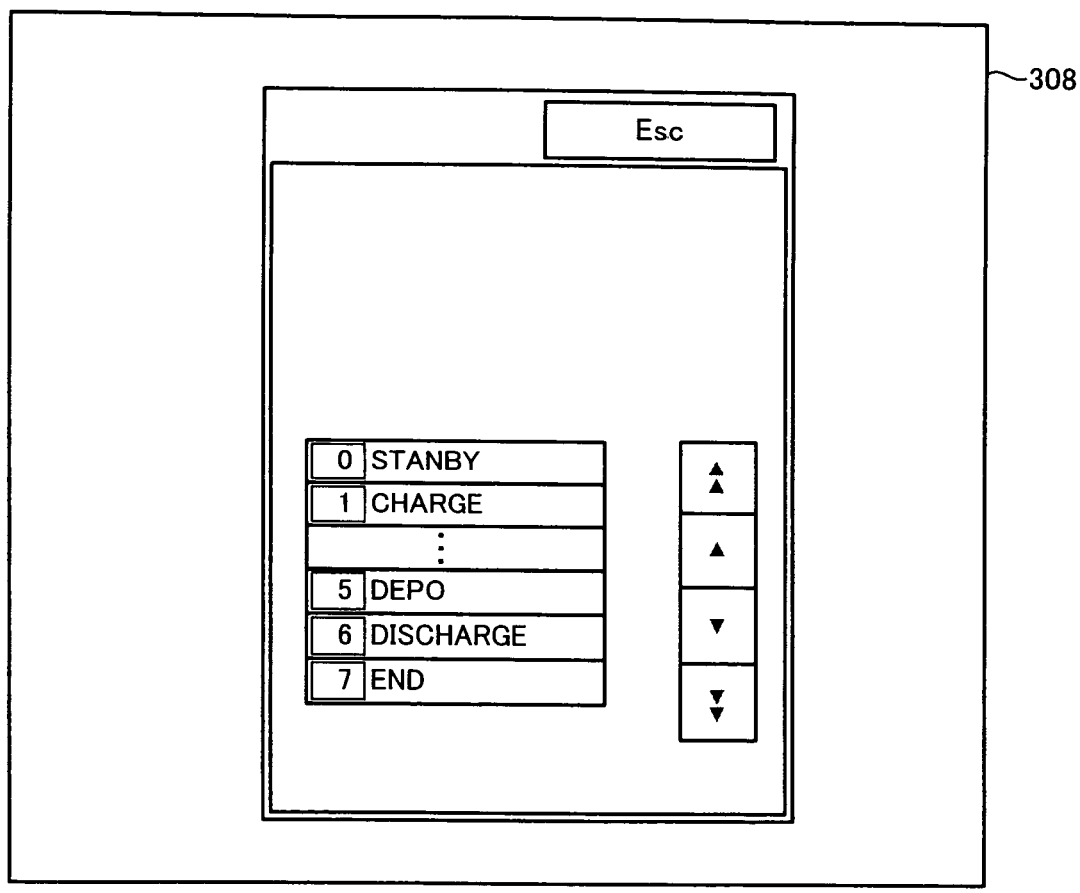
FIG. 11 is a view showing an exemplary display of step number and step name on the operation screen of the substrate processing apparatus according to the embodiment of the invention.

FIG. 11 is displayed when the history display section 352 is pressed. On this screen, the step number and step name of all the steps of a selected recipe are shown. Moreover, when the step name is pressed, the display shifts to a menu screen, and recipe setting information and trouble information can be confirmed from this menu screen. Also, the recipe setting information and the like can be directly displayed without using the menu screen. When the ESC button on the screen of FIG. 11 is pressed, for example, the display returns to the recipe transition history screen of FIG. 8 or the like. Also, the color of the step number and step name is varied depending on the status of processing. A step which has not been executed is shown in gray. A step which is being executed is shown to be blinking in green and gray. A step which has been executed is shown in green.

Next, the operation by the operator in the case where the reset recipe is being executed for different factors, as in FIG. 7(b) and FIG. 8, will be described specifically.

As shown in FIG. 7(b), when the operator has made an error, the situation varies roughly depending on whether the boat is in the processing furnace or not. If the boat has been lowered from the processing furnace, it suffices to confirm whether there is anomaly in the apparatus or not, just in case, after discharging the wafers. If the boat is in the processing furnace, the inside of the processing furnace is set in a secure state so that the boat can be taken out. For example, cycle purge or the like is manually carried out. After the boat is taken out and the wafers are discharged, similarly, it suffices to confirm whether there is anomaly in the apparatus or not.

In FIG. 8, an alarm occurrence factor is investigated. If the alarm occurrence factor is the breaking of wire in the heater, a heater is prepared. If the factor is the breaking of the thermocouple, a thermocouple is prepared. In which step the reset recipe is executed is confirmed on the operation screen 308, and whether the boat is in the processing furnace or not is grasped. If the boat has been lowered from the processing furnace, the wafers are discharged and the heater (or thermocouple) is replaced with the prepared heater (or thermocouple). If the boat is in the processing furnace, the state of the apparatus is confirmed. If it is not in a secure state, cycle purge or the like is manually carried out. Thus, the apparatus is set in a secure state and the boat is lowered. After the wafers are discharged, recovery operation (replacement of the heater or thermocouple) is carried out. When the reset recipe is executed in accordance with the alarm occurrence factor, it is considered that a serious trouble has occurred in the apparatus and therefore the initial operation is important. In this embodiment, the initial operation can be quickly carried out. Also, in this embodiment, since the transition history of plural recipes and the factors of transition are displayed on the operation screen 308, the state of the apparatus can be easily grasped. Therefore, even if a trouble (failure or an error by the operator or the like) occurs in the apparatus, recovery processing can be easily carried out and therefore the recovery processing time in the apparatus can be reduced.

Next, the display of step history will be described with reference to FIG. 9.

Figure 9:
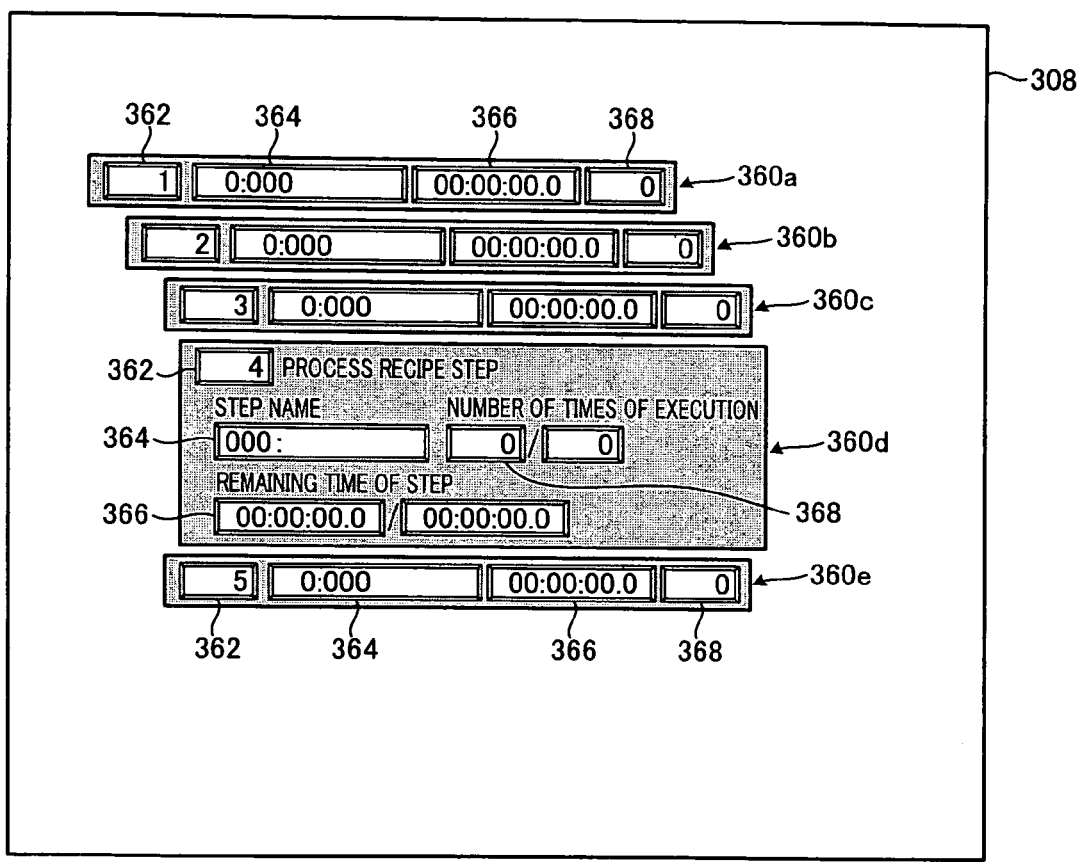
FIG. 9 is a view showing an exemplary display of step history on the operation screen of the substrate processing apparatus according to the embodiment of the invention.

FIG. 9 shows an exemplary display of step history.

In FIG. 9, a step which is being executed and steps before and after this step are displayed on the operation screen 308. Specifically, plural (in FIG. 9, five) steps of the process recipe are displayed in step display sections 360a, 360b, 360c, 360d, 360e on the operation screen 308. The step display section 360d shows a step which is being executed. The step display sections 360a, 360b, 360c show finished steps which are immediately before that step. The step display section 360e shows a step scheduled to be executed. In each of the step display sections 360a to 360d, the step number 362, the step ID (step name) 364, the remaining time of the step 366, the number of times of execution of the step 368 and the like are displayed.

As the step history is thus displayed on the operation screen 308, the status of the step which is currently being executed and the steps before and after the step can be grasped easily and in a short time.

As described above, according to the present invention, for example, when a reset recipe is being executed, whether the reset recipe is singly executed or it is executed from another recipe for a certain factor can be grasped on the basis of the display of transition history of plural recipes and the display of step history. Therefore, quick measures can be taken when a trouble has occurred, and the time until trouble shooting is carried out can be reduced. Thus, the recovery processing time (downtime) in the apparatus can be reduced. Also, when a product (substrate) is being processed in the substrate processing apparatus 100, the state of the apparatus can be quickly grasped and therefore measures can be easily taken to prevent the product from becoming a lot-out product.

In the present invention, not only a semiconductor manufacturing apparatus but also an apparatus that processes a glass substrate such as an LCD device can be applied as a substrate processing apparatus. Also, the deposition process includes, for example, CVD, PVD, processing to form an oxide film or nitride film, processing to form a metal-containing film, and so on. Also, while the vertical-type apparatus is described in this embodiment, the invention can similarly be applied to a single wafer apparatus.

INDUSTRIAL APPLICABILITY

The present invention can be utilized for a substrate processing apparatus which processes a substrate of a semiconductor device or the like.

The invention claimed is:

1. A recipe display method comprising:
a step of accepting an execution instruction to cause execution of an arbitrary recipe of plural recipes that include at least a process recipe and a reset recipe;
a first display step, in which the arbitrary recipe is displayed on an operation screen; and
a determination step of determining whether the arbitrary recipe is the process recipe,
wherein when the arbitrary recipe is the process recipe, the process recipe is executed and displayed, and when an execution instruction to cause another recipe to be executed is received during the execution of the process recipe, a second display step is performed in which the process recipe and the other recipe are displayed on the operation screen together with a factor which has generated the execution instruction to cause the other recipe to be executed, the factor being displayed between the process recipe and the other recipe, the second display step showing a status of a transition from the process recipe to the reset recipe, and wherein step information of the process recipe is displayed including number of times of execution of a step;
wherein, when the arbitrary recipe is the reset recipe, the reset recipe is executed and displayed singly without executing the second display step, and
wherein processing is performed according to the reset recipe to end in a secure state, and an end step is displayed.

2. The recipe display method according to claim 1, further comprising:
storing each of the process recipe, a sub recipe, the reset recipe, an alarm recipe, and an abort recipe, for designation as the arbitrary recipe and the other recipe.

3. The recipe display method according to claim 1, wherein the factor includes at least one of a step command, an alarm condition, and a PM command.

4. The recipe display method according to claim 3, wherein the step command includes at least one of RESET, END, HOLD, BUZZER, JUMP(STEP), and SUB RECIPE.

5. The recipe display method of claim 1,
wherein the step information of the process recipe and the reset recipe is displayed on the operation screen along with the process recipe, the reset recipe, and the factor.

6. The recipe display method of claim 1, wherein the reset recipe is executed according to a user's intention or is executed as a result of transition from another recipe.

7. A substrate processing apparatus comprising:
a recipe storage unit that stores plural recipes including at least a process recipe and a reset recipe;
a display control unit that accepts an execution instruction to cause an arbitrary recipe of the plural recipes to be executed;
a display unit that displays the arbitrary recipe designated by the display control unit on an operation screen; and
a main control unit that determines whether the arbitrary recipe is a process recipe,
wherein when the arbitrary recipe is the process recipe, the process recipe is executed and displayed, and when an execution instruction to cause another recipe stored in the recipe storage unit to be executed is received during the execution of the process recipe, the display control unit causes the process recipe and the other recipe to be displayed on the operation screen together with a factor which has generated the execution instruction to cause the other recipe to be executed, the factor being displayed between the process recipe and the other recipe, and the display unit displays a status of a transition from the process recipe to the reset recipe, and displays step information of the process recipe including number of times of execution of a step;
wherein when the arbitrary recipe is the reset recipe, the reset recipe is executed and displayed singly without executing and displaying the other recipe on the operation screen; and
wherein processing is performed according to the reset recipe to end in a secure state, and an end step is displayed.

8. The substrate processing apparatus of claim 7, wherein the recipe storage unit stores each of the process recipe, a sub recipe, the reset recipe, an alarm recipe, and an abort recipe, for designation as the arbitrary recipe and the other recipe.

9. The substrate processing apparatus of claim 7, wherein the factor includes at least one of a step command, an alarm condition, and a PM command.

10. The substrate processing apparatus of claim 9, wherein the step command includes at least one of RESET, END, HOLD, BUZZER, JUMP(STEP), and SUB RECIPE.

11. The substrate processing apparatus of claim 7, wherein the step information of the process recipe and the reset recipe is displayed on the operation screen along with the process recipe, the reset recipe, and the factor.

12. The substrate processing apparatus of claim 7, wherein the reset recipe is executed according to a user's intention or is executed as a result of transition from another recipe.

13. A trouble processing method for a substrate processing apparatus, the trouble processing method comprising:
the recipe display method of claim 1:
and further including a step of recovery processing that eliminates the factor which has triggered the execution of the reset recipe.

14. The trouble processing method of claim 13, wherein the step of recovery processing includes replacement or repair of one or more of: a heater, a thermocouple, a valve, or a pump.

15. The trouble processing method of claim 13, further comprising:
a step of grasping whether a substrate holding tool is in a processing furnace or not,
wherein the step of recovery processing is different according to whether the substrate holding tool is in a processing furnace or not.

16. A substrate processing method comprising:
a step of accepting an execution instruction to cause execution of an arbitrary recipe of plural recipes that include at least a process recipe and a reset recipe;
a step of displaying the arbitrary recipe on an operation screen;
a step of determining whether the arbitrary recipe is the process recipe,
wherein when the arbitrary recipe is the process recipe, the process recipe is executed and displayed, and when an execution instruction to cause another recipe to be executed is received during the execution of the process recipe, the process recipe and the other recipe are displayed on the operation screen together with a factor which has generated the execution instruction to cause the other recipe to be executed, the factor being displayed between the process recipe and the other recipe, a display showing a status of a transition from the process recipe to the reset recipe, and displaying step information of the process recipe including number of times of execution of a step; and
a step of processing a substrate according to the process recipe;

wherein when the arbitrary recipe is the reset recipe, the reset recipe is executed and displayed singly without executing and displaying the other recipe on the operation screen, and processing is performed according to the reset recipe to end in a secure state, and an end step is displayed.

* * * * *